United States Patent [19]
Dingwall

[11] 3,936,859
[45] Feb. 3, 1976

[54] SEMICONDUCTOR DEVICE INCLUDING A CONDUCTOR SURROUNDED BY AN INSULATOR

[75] Inventor: Andrew Gordon Francis Dingwall, Somerville, N.J.

[73] Assignee: RCA Corporation, New York, N.Y.

[22] Filed: Apr. 22, 1975

[21] Appl. No.: 570,516

Related U.S. Application Data

[63] Continuation of Ser. No. 385,669, Aug. 6, 1973, abandoned.

[52] U.S. Cl. .................... 357/23; 357/52; 357/55
[51] Int. Cl.² ................ H01L 29/78; H01L 29/34; H01L 29/06
[58] Field of Search .................... 357/23, 52, 55

[56] References Cited
UNITED STATES PATENTS
3,761,327   9/1973   Harlow et al. .................... 357/23

Primary Examiner—Stanley D. Miller, Jr.
Assistant Examiner—E. Wojciechowicz
Attorney, Agent, or Firm—H. Christoffersen; R. P. Williams

[57] ABSTRACT

A silicon-gate insulated gate field effect transistor device has a thick field oxide in contiguous surrounding relation to its gate electrode and with a surface coplanar with or slightly higher than the surface of the gate electrode, thus facilitating crossovers and contacts to the gate electrode. The method of making this device includes forming a self-aligned silicon gate structure on a silicon wafer, masking the gate structure against the diffusion of oxygen, and thereafter oxidizing the silicon wafer to grow a thick silicon dioxide layer in surrounding relation to the silicon gate structure.

6 Claims, 8 Drawing Figures

SEMICONDUCTOR DEVICE INCLUDING A CONDUCTOR SURROUNDED BY AN INSULATOR

This is a continuation of application Ser. No. 385,669 filed Aug. 6, 1973, now abandoned.

This invention relates to semiconductor devices, such as integrated circuit devices, which include insulated gate field effect transistors of the so-called self-aligned silicon gate type.

The self-alignment process for making insulated gate field effect transistors is well known. One version of the process is disclosed, for example, in Kerwin et al., U.S. Pat. No. 3,475,234. This process generally involves the diffusion of the source and drain regions of an insulated gate field effect transistor using a silicon gate electrode structure as part of the diffusion mask, with simultaneous or subsequent diffusion of conductivity modifiers into the silicon gate electrode to render it conductive. The silicon gate electrode may be oxidized, or a separate insulating coating may be provided over the silicon gate electrode, so that interconnection conductors can cross the gate structure.

Silicon gate integrated circuit devices in which the design requires interconnection conductors to cross over the silicon gates have had relatively low yields resulting primarily from opens in the crossing conductors at the edges of the silicon gates. The silicon gates are made by photolithographic etching processes from polycrystalline silicon and this material has a tendency to undercut when it is etched, that is, the etchant proceeds into the material in such a way that an overhanging edge is produced. It is difficult to maintain conductor continuity over such an edge.

Several solutions have been proposed for this yield problem. For example, special etchants have been devised which will act faster on the upper portions of the polycrystalline silicon than on the lower portions so that a sloped rather than an overhanging edge is produced. It has been difficult with these etchants, however, to control the width of the silicon gates. Another known solution has been to coat the silicon gate electrode with a glass having a relatively low melting temperature and to heat this glass to a temperature near its melting temperature to provide rounded contours at the edges of the silicon gates. The glass coatings thus formed are relatively thick, and the metal which is disposed on them must therefore pass over relatively high steps, counteracting the benefit of the rounded contours. Moreover, the thickness of the glass makes it difficult to provide precise contact openings through the glass to the silicon therebeneath.

There is another problem which exists with all of the above-described approaches. Whenever an insulator must be applied over a silicon gate electrode so that a second layer of interconnection conductors can cross over the silicon gate electrode, a relatively large area must be provided somewhere on the silicon gate electrode to enable contact to be made thereto. A large contact area is required because the insulator must be etched off to make contact and because care must be taken to insure that the area which is removed overlies only the silicon gate electrode. If there is misalignment of the contact opening with the silicon gate electrode, it is likely that the etchant may dissolve not only the insulating material (usually silicon dioxide) over the silicon gate but also some of the insulator (also silicon dioxide) over the main body of silicon, thus creating a danger of short circuits between a subsequently deposited conductive material and the main silicon body. The requirement for a relatively large area for contact to a silicon gate is therefore inconsistent with the generally desired result of reducing the size of each individual transistor as much as possible.

The present novel device and method for its manufacture provide a solution to both of these problems. In the present device, crossovers are facilitated by surrounding the gate electrode structure with insulating material, and contact openings can be made which are self-aligned with the silicon gate electrodes, without need for critical mask alignments or large contact areas.

The present device and method include certain elements which are known in the art. For example, the method and structure involve the use of refractory gate electrode materials. This is known, for example, in the silicon gate process of Kerwin et al. mentioned above. Further, the structure and process involve the use of a thick field oxide similar to that disclosed, for example, in Kooi, U.S. Pat. No. 3,676,921. The prior art also contains the general teaching that a thick oxide process may be combined with a self-aligned silicon gate process. See Morandi, "Planox Process Smooths Path to Greater MOS Density," *Electronics*, Dec. 20, 1971, pages 44–48, at page 48. The prior art does not disclose or suggest, however, in what manner these processes can be combined to solve both the crossover problem and the contact opening problem described above.

Figure 4:
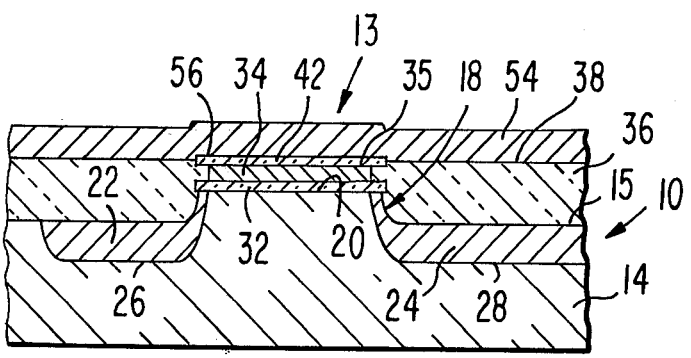
FIG. 4 is a partial cross-sectional view through a device made by the present novel process and illustrating a crossover of deposited metal over a silicon gate electrode or interconnection conductor.
Figure 8:
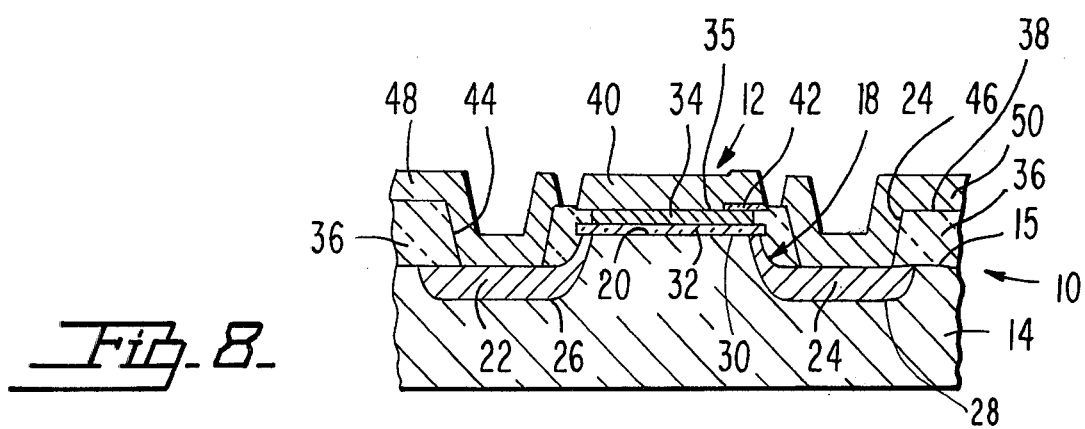

FIGS. 4 and 8 may be taken as two cross sections through a finished device 10 at different points along a silicon gate electrode or interconnection conductor therein. FIG. 8 shows, as an example of a semiconductor element in the device 10, the structure of an insulated gate field effect transistor 12, and FIG. 4 shows the structure of a crossover 13.

The device 10 is made in a body 14 of semiconductive material, usually silicon, having a surface 15 thereon adjacent to which the active elements of the insulated gate field effect transistor 12 are disposed. The structures shown in the drawings are fragmentary parts of a silicon wafer in which many transistors and many integrated circuit devices are fabricated, in the manner well known in the art.

The body 14 has a mesa 18 (FIG. 8) projecting from the surface 15 thereof, and the mesa 18 has a flat surface 20 thereon which is generally parallel to the surface 15 of the body 14. Spaced regions 22 and 24 which are bounded by PN junctions 26 and 28, respectively, are disposed within the body 14 with portions thereof in the mesa 18 adjacent to the sides thereof. These regions will function as the source and drain regions for the insulated gate field effect transistor 12. Depending on the requirements of the circuit in which the device is used, the regions 22 and 24 are both of one type conductivity, i.e., both are P type or both are N type, and there is a channel zone 30 of the body 12 and the mesa 18 between the regions 22 and 24 which is of conductivity type opposite to that of the regions 22 and 24. the channel zone 30 may contain a surface channel region, not shown, of the one type conductivity if the insulated gate field effect transistor 12 is intended for use in the depletion mode. As shown, the insulated gate field effect transistor 12 is an enhancement mode unit and no surface channel is present as part of the structure of the device.

Means including a layer of conductive material such as polycrystalline semiconductive material, in this case defining a gate electrode structure, is disposed on the body 14. The gate electrode structure is disposed over the channel zone 30 and comprises a layer 32 of insulating material, usually thermally grown silicon dioxide, on the surface 20 of the mesa 18 and a layer 34 of conductive material adjacent to the layer 32 of insulating material. The insulating layer 32 may be a single layer as shown, or it may be made up of plural layers of two or more different materials, such as deposited silicon dioxide or silicon nitride, in a manner known in the art.

The layer 34 of conductive material is shaped to serve as an electrode of the transistor 12 and has a planar surface 35 which is substantially parallel to the surface 20 of the mesa 18 faces away from the body 14, and is spaced from the surface 15 of the body 14 by a predetermined distance determined by the combined thicknesses of the insulating layer 32 and the conductive layer 34 and the height of the mesa 18. The layer 34 of conductive material is of refractory material, such as polycrystalline silicon, so that it can withstand relatively high temperatures, which are used in the present novel method as will be described below.

A relatively thick single-layered homogeneous body 36 of insulating material, preferably genetic silicon dioxide, is disposed on the surface 15 of the body 14 in contiguous, surrounding relation to the mesa 18 and also in contiguous, surrounding relation to the insulating layer 32 and the conductive layer 34. This body 36 has a surface 38 thereon which is generally parallel to the surface 15 of the body 14. A feature of the present invention is that the surface 38 of the body 36 is spaced the same distance or further from the surface 15 of the body 14 than the surface 35 of the conductive layer 34 is spaced from the surface 15. In other words, the surface 35 of the conductive layer 34 is everywhere the same distance or closer to the surface 15 of the body 14 than the surface of the body 36 is to that surface. The distance separating these two surfaces 35 and 38 should be in the range of 0 A to about 1000 A.

A conductor 40 overlies and makes contact to the conductive layer 34. As shown, the conductor 40 does not contact the conductive layer 34 over all of its area but is insulated therefrom over a small area by a layer 42 which is of oxygen-impermeable insulating material for a purpose which will be described below. The layer 42 may or may not be present in the final device and is shown in FIG. 8 for illustrative purposes only. When it is present, the layer 42 is a result of misalignment of a contact opening photomask, in a manner which will also be explained below.

To connect the regions 22 and 24 of the insulated gate field effect transistor 12 to other parts of the device 10, contact openings 44 and 46 are made in the body 36 of insulating material, and conductors 48 and 50 extend into the openings 44 and 46, respectively, to contact the regions 22 and 24.

As mentioned above, at another location in the device 10, there may be a crossover 13, as shown in FIG. 4. Wherever the circuit in which the device is used requires that in interconnection conductor, here shown as 54, must cross over the conductive layer 34, the insulator layer 42 overlies the entire surface 35 of the conductive layer 34. Since the surface 38 of the body 36 of insulating material is above the surface 35 of the conductive layer 34, the conductive layer 34 is embedded in insulating material. Consequently, the conductor 54 can cross over the conductive layer 34 in insulated relation thereto. The insulator layer 42 should be relatively thin, e.g., less than about 1,000 A, so that it has an upper surface 56 which is relatively close to, i.e., no more than about 1,000 A from, the surface 38 of the body 36, so that conductor 54 need not cross a high step.

The present novel method is illustrated by the sequential cross-sectional views of FIGS. 1 to 3, 5 to 8, and 4. The distinctive steps of the method are shown and nondistinctive conventional steps of cleaning, washing, and photomasking are omitted for clarity.

Figure 1:
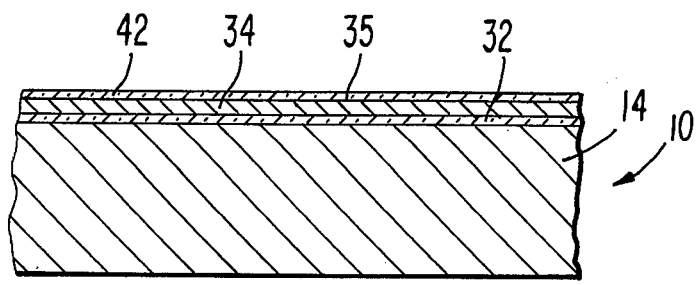
FIGS. 1 to 3 are partial cross-sectional views which illustrate some of the steps of a process which include the present novel process.

The process begins, as illustrated in FIG. 1, with the step of growing the layer 32 of insulating material on the original upper surface of the body 14. This may be done in conventional manner; that is, by heating the body 14 in an oxidizing ambient to a temperature of about 1,000°C for a time long enough to grow the layer 32 to a thickness of about 1,000 A. Next, the conductive layer 34 is formed on the surface of the insulator layer 32. This conductive layer 34 may also be formed conventionally, for example, by heating the body 14 to a temperature between about 550°C and about 750°C in an atmosphere containing a source of silicon atoms, such as silane ($SiH_4$), to form the layer 34 by the pyrolytic decomposition of the silane. The time and temperature of this step should be selected such that the conductive layer 34 has a thickness between about 3,000 A and about 6,000 A. The conductive layer 34 may be doped either during its formation by including in the growth atmosphere a source of conductivity modifiers, such as diborane or phosphine, or it may be doped after its formation.

The conductive layer 34 is next coated with the layer 42 of an oxygen-impermeable insulating material. Preferably, this material is silicon nitride ($Si_3N_4$), which may be formed, for example, by the pyrolytic decomposition of silane and ammonia on the surface 35 of the conductive layer 34 at a temperature of about 1,000°C. This procedure is also well known in the art.

Figure 2:
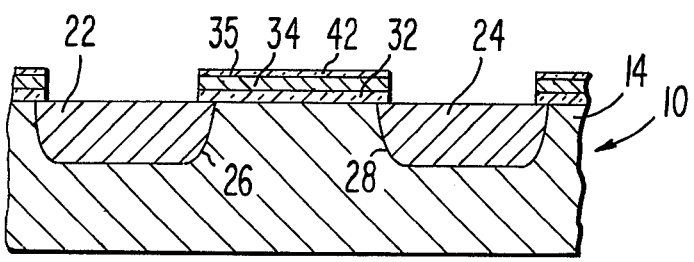

FIG. 2 illustrates the next few steps in the process. Conventional photolithographic processes are used to remove portions of the silicon nitride layer 42 to leave a pattern which will define the locations and areas of the diffusion openings for regions 22 and 24 and any other similar regions (not shown) in the device 10. The defined silicon nitride layer 42 is then used as an etch mask for the removal of portions of the conductive layer 34 and the insulator layer 32 to complete the definition of the diffusion openings for the regions 22 and 24, i.e., to produce a configuration as shown in FIG. 2. The next step is to form the regions 22 and 24 by diffusing conductivity modifiers into the body 14, by any desired method. As in the self-aligned process of Kerwin et al. mentioned above, a portion of the conductive layer 34 which will become the gate electrode is self-aligned with the junctions 26 and 28 bounding the regions 22 and 24. In other words, the layered structure consisting of the layers 42, 34, and 32 shown at the center of FIG. 2 has lateral boundaries spaced from each other at a distance which, owing to this process, is substantially equal to the length of the channel zone 30 of the insulated gate field effect transistor 12. Some overlap of the conductive layer 34 with the regions 22 and 24 will exist at this point in the process owing to side diffusion of the regions 22 and 24. The regions 22 and 24 should be diffused relatively deeply into the body 14, and the depth of this diffusion will depend on the thickness desired for the body 36 of insulating material, i.e., the depth of this diffusion should be greater than the depth of the body 36 in the body 14, so that part of the regions 22 and 24 will remain after the body 36 is formed.

Figure 3:
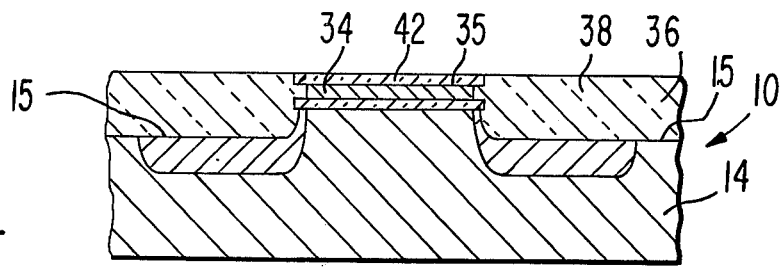

An etch mask is next formed over those portions of the silicon nitride layer 42 which are over the portions of the conductive layer 34 which are intended to remain as gate electrodes and interconnection conductors, and the undesired portions of the layers 42, 34, and 32 are then removed. The body 14 is next exposed to an oxidizing atmosphere at a relatively low temperature for a time long enough to form the body 36 of insulating silicon dioxide to the desired thickness (FIG. 3). For example, the body 14 may be heated to a temperature of about 900°C in steam for the necessary time. The oxidation process consumes part of the body 14 by chemically combining with the silicon thereof, and the body 36 has a thickness approximately twice the depth of the silicon consumed. Thus, for example, if the surface 35 of the silicon gate 34 is spaced about 5,000 A from the original surface of the body 14, the oxidation process used to form the body 36 should be carried out long enough to consume about 5,000 A of the body 14, thus growing the body 36 to a thickness of about 10,000 A and locating its surface 38 coplanar with or slightly above the surface 35 of the layer 34. The time of this oxidation step will vary with the temperature chosen and with the thickness of the gate structure and may be determined routinely. For example, for the 900°C oxidation temperature mentioned above, and to grow the body 36 to a thickness of 10,000 A, the time in steam would be on the order of 8 hours. A major portion of the conductive layer 34 does not oxidize during this step since it is protected by the oxygen-impermeable character of the coating 42. However, some oxidation of the conductive layer 34 will take place at the sides of the gate electrode structure which will narrow the conductive layer 34 somewhat and produce a configuration like that shown in FIG. 3, for example. This narrowing of the conductive layer 34 will reduce its overlap with the regions 22 and 24, thus reducing the capacitance between the layer 34 and the regions 22 and 24.

Figure 5:
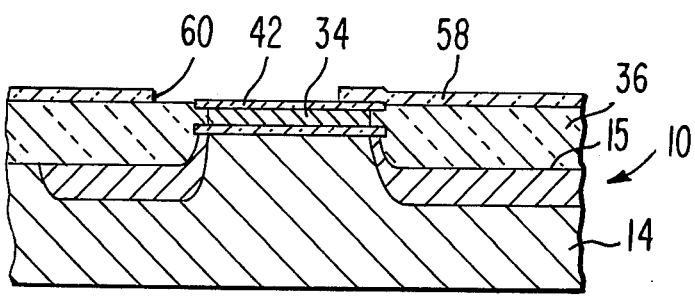
FIGS. 5 to 8 are cross-sectional views showing a series of steps carried out beyond the step illustrated in FIG. 3, illustrating the present novel method of forming a contact opening to a silicon gate electrode.
Figure 6:
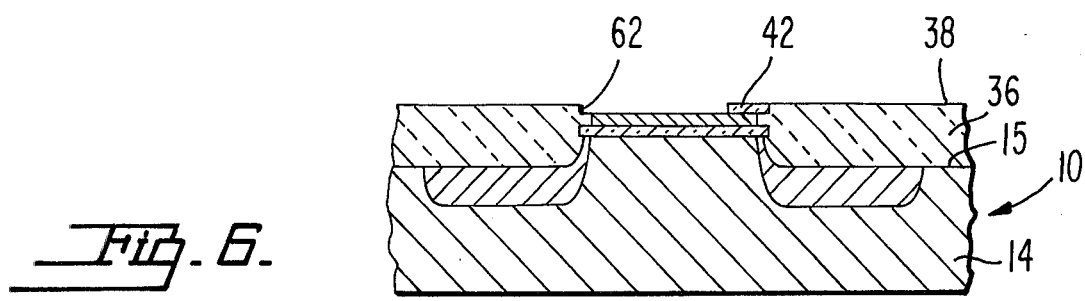
Figure 7:
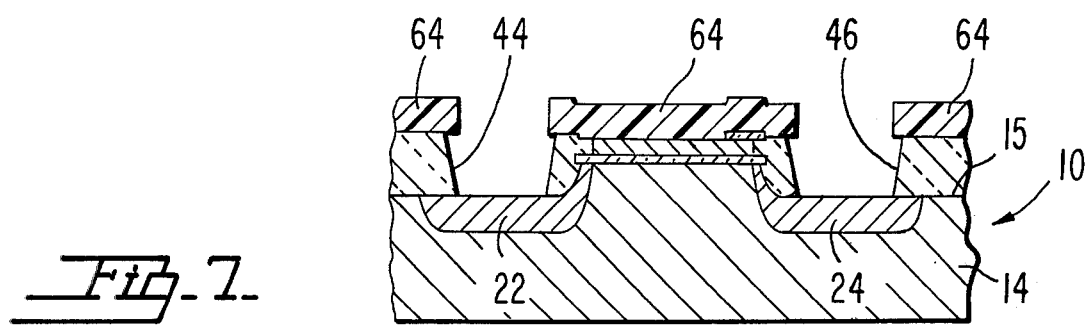

The next steps, illustrated in FIGS. 5 and 6, are used to make contact openings to the conductive layer 34 where desired. The first of these steps is to form a mask 58 on the upper surface of the device 10 of a material which will mask against a solvent for silicon nitride, such as hot phosphoric acid, and to form an opening 60 therein at the desired location of the contact opening. A feature of this invention is that the opening 60 in the mask 58 need not be critically aligned over the conductive layer 34, because the solvents for silicon nitride, such as the phosphoric acid mentioned above, do not attack silicon dioxide, and all that is required is that the opening 60 overlie enough area of the silicon gate 34 to provide an adequately large contact area. In this example, the mask 58 is shown as misaligned to the left.

The configuration of the device 10 after the removal of the exposed portions of the silicon nitride coating 42 is shown in FIG. 6. The left boundary 62 of the opening is substantially aligned with the edge of the silicon gate because of the different etching rates of silicon nitride and silicon dioxide, i.e., because of the masking effect of the body 36 of silicon dioxide. If there were no oxidation of the edge of the conductive layer 34, the left boundary 62 of the opening would be exactly aligned with the edge of the silicon gate. As mentioned earlier, a part of the coating 42 of silicon nitride may remain due to misalignment, but this is not critical.

The contact openings 44 and 46 to the regions 22 and 24 are next opened in conventional fashion. Thus, for example, a photoresist coating 64 (FIG. 7) is applied over the surface of the device 10 and exposed and developed to form an etch mask having openings where the contact openings 44 and 46 are desired. Exposure to a solvent for silicon dioxide will then form the contact openings 44 and 46.

After removal of the photoresist coating 64, the device may be metallized by, for example, depositing aluminum thereon, and the deposited aluminum is then defined photolithographically to form the conductors 40, 48, 50, and 54.

The present novel device, fabricated in this manner, has a very flat surface in the vicinity of the silicon conductive layer 34 so that crossovers are facilitated and yield losses due to opens in metallization at crossover locations are reduced. Critical mask alignments for making contact openings to the silicon conductive layer are not required and the area of contacts to the silicon conductive layer may be minimized, owing to the self-alignment of the contact openings.

While only one type of insulated gate field effect transistor has been shown and described, the present invention is not limited to integrated circuit devices using only one type of insulated gate field effect transistor (P-MOS or N-MOS devices) but may also be used in CMOS devices in which both types of insulated gate field effect transistors are employed.

What is claimed is:

1. An insulated gate field effect semiconductor device comprising
    a body of silicon having a first surface, a mesa projecting from said first surface, and a second surface on said mesa generally parallel to said first surface,
    regions of one type conductivity in said mesa adjacent to respective opposite sides of said mesa, a zone of said mesa between said regions being of conductivity type opposite to that of said regions,
    a layer of insulating material on said second surface of said body of silicon,
    a layer of conductive material adjacent to said layer of insulating material and having a planar surface substantially parallel to the second surface of said body of silicon, and
    a single-layered homogeneous body of insulating material on said first surface of said body of silicon and in contiguous surrounding relation to said mesa, said insulating layer, and said conductive layer, and having a surface spaced from and substantially parallel to said first surface of said body of silicon, said planar surface of said conductive layer being everywhere the same distance from or closer to said first surface of said body of silicon than the surface of said body of insulating material is to said first surface of said body of silicon when these distances are measured in a direction substantially normal to said first surface of said body of silicon.

2. A semiconductor device as defined in claim 1 wherein said conductive layer is polycrystalline silicon.

3. A semiconductor device as defined in claim 1 further comprising
    a second layer of insulating material on said surface of said conductive layer, a surface of said second layer of insulating material being substantially parallel to and spaced no further than about 1,000 A from said surface of said body of insulating material.

4. A semiconductor device as defined in claim 3 further comprising
    a layer of conductive material extending continuously adjacent to said body of insulating material and said second layer of insulating material.

5. A semiconductor device as defined in claim 3 further comprising
    means defining an opening in said second layer of insulating material, and
    a continuous conductor layer extending adjacent to said body of insulating material and contacting said conductor layer.

6. A semiconductor device comprising
    a body of semiconductive material having a surface,
    a semiconductor element including a layer of conductive material on said body, shaped to serve as an electrode of said element, said layer having a planar surface which is generally parallel to said surface of said body and which faces away from said body,
    said layer of conductive material being contiguously surrounded by a layer of a first insulating material on said body, said layer of insulating material having a surface which is generally parallel to said surface of said body and which faces away from said body and is spaced from said surface of said body by a distance at least as great as the distance by which said planar surface of said layer of conductive material is spaced from said surface of said body,
    a layer of a second insulating material which is soluble in a solvent which will not attack said first insulating material on a portion only of said layer of conductive material, and
    a conductor overlying and making contact to said layer of conductive material and being partially insulated therefrom by said layer of second insulating material.

* * * * *